(12) United States Patent
Johnson et al.

(10) Patent No.: US 7,221,691 B2
(45) Date of Patent: May 22, 2007

(54) VERSATILE METHOD AND SYSTEM FOR SINGLE MODE VCSELS

(75) Inventors: Ralph H. Johnson, Murphy, TX (US); Gilberto Morales, Arlington, TX (US)

(73) Assignee: Finisar Corporation, Sunnyvale, CA (US)

( * ) Notice: Subject to any disclaimer, the term of this patent is extended or adjusted under 35 U.S.C. 154(b) by 17 days.

(21) Appl. No.: 10/617,290

(22) Filed: Jul. 10, 2003

(65) Prior Publication Data

US 2004/0066819 A1 Apr. 8, 2004

Related U.S. Application Data

(62) Division of application No. 09/724,820, filed on Nov. 28, 2000, now Pat. No. 6,905,900.

(51) Int. Cl.
*H01S 5/00* (2006.01)
*H01S 3/08* (2006.01)

(52) U.S. Cl. .............. 372/45.01; 372/46.013; 372/46.015; 372/99

(58) Field of Classification Search .......... 372/45.01, 372/46.013, 46.015, 99
See application file for complete search history.

(56) References Cited

U.S. PATENT DOCUMENTS

| | | | |
|---|---|---|---|
| 4,317,085 A | 2/1982 | Burnham et al. | |
| 4,466,694 A | 8/1984 | MacDonald | |
| 4,660,207 A | 4/1987 | Svilans | |
| 4,675,058 A | 6/1987 | Plaster | |
| 4,784,722 A | 11/1988 | Liau et al. | |
| 4,885,592 A | 12/1989 | Kofol et al. | |
| 4,901,327 A | 2/1990 | Bradley | |
| 4,943,970 A | 7/1990 | Bradley | |
| 4,956,844 A | 9/1990 | Goodhue et al. | |
| 5,031,187 A | 7/1991 | Orenstein et al. | |
| 5,052,016 A | 9/1991 | Mahbobzadeh | |
| 5,056,098 A | 10/1991 | Anthony et al. | |
| 5,062,115 A | 10/1991 | Thornton | |
| 5,068,869 A | 11/1991 | Wang et al. | |

(Continued)

FOREIGN PATENT DOCUMENTS

DE 4240706 A1 6/1994

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635-644.
Bowers et al., "Fused Vertical Cavity Lasers With Oxide Aperture", Final report for MICRO project 96-042, Industrial Sponsor: Hewlett Packard, 4 pages, 1996-97.
Catchmark et al., "High Temperature CW Operation of Vertical Cavity Top Surface-Emitting Lasers", CLEO 1993, p. 138.

(Continued)

*Primary Examiner*—James Menefee
(74) *Attorney, Agent, or Firm*—Workman Nydegger

(57) ABSTRACT

A system and method for providing a single mode VCSEL (vertical cavity surface emitting laser). A lower mirror is formed on a substrate. An active region including one or more quantum wells is formed over the lower mirror. The upper mirror formed over the active region can include multiple layers and may be formed to be have substantially isotropic conductivity. The layers in the upper mirror can include a lightly doped DBR layer, a heavily doped second layer including an isolation region, and a third heavily doped DBR layer. The active region may include conduction layers, which may be periodically doped, to improve conductivity and reduce free carrier absorption.

16 Claims, 5 Drawing Sheets

U.S. PATENT DOCUMENTS

| | | |
|---|---|---|
| 5,079,774 A | 1/1992 | Mendez et al. |
| 5,115,442 A | 5/1992 | Lee et al. |
| 5,117,469 A | 5/1992 | Cheung et al. |
| 5,140,605 A | 8/1992 | Paoli et al. |
| 5,157,537 A | 10/1992 | Rosenblatt et al. |
| 5,158,908 A | 10/1992 | Blonder et al. |
| 5,212,706 A | 5/1993 | Jain |
| 5,216,263 A | 6/1993 | Paoli |
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt et al. |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,422,901 A | 6/1995 | Lebby et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A * | 2/1996 | Choquette et al. ............ 372/46 |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | 10/1996 | Lear |
| 5,574,738 A | 11/1996 | Morgan |
| 5,581,571 A | 12/1996 | Holonyak, Jr. et al. |
| 5,586,131 A | 12/1996 | Ono et al. |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,633,527 A * | 5/1997 | Lear ............ 257/432 |
| 5,642,376 A | 6/1997 | Olbright et al. |
| 5,645,462 A | 7/1997 | Banno et al. |
| 5,646,978 A | 7/1997 | Kem et al. |
| 5,648,978 A | 7/1997 | Sakata |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,729,566 A * | 3/1998 | Jewell ............ 372/96 |
| 5,764,674 A * | 6/1998 | Hibbs-Brenner et al. ...... 372/46 |
| 5,774,487 A | 6/1998 | Morgan |
| 5,778,018 A | 7/1998 | Yoshikawa et al. |
| 5,781,575 A | 7/1998 | Nilsson |
| 5,784,399 A | 7/1998 | Sun |
| 5,790,733 A | 8/1998 | Smith et al. |
| 5,805,624 A | 9/1998 | Yang et al. |
| 5,812,581 A * | 9/1998 | Cox ............ 372/50 |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A * | 11/1999 | Thornton ............ 372/96 |
| 5,991,326 A | 11/1999 | Yuen et al. |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,064,683 A | 5/2000 | Johnson |
| 6,078,601 A | 6/2000 | Smith |
| 6,086,263 A | 7/2000 | Selli et al. |
| 6,133,590 A | 10/2000 | Ashley et al. |
| 6,144,682 A | 11/2000 | Sun |
| 6,154,480 A | 11/2000 | Magnusson et al. |
| 6,185,241 B1 | 2/2001 | Sun |
| 6,191,890 B1 | 2/2001 | Baets et al. |
| 6,208,681 B1 | 3/2001 | Thorton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,369,403 B1 | 4/2002 | Holonyak, Jr. |
| 6,372,533 B2 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B2 | 10/2002 | Jewell |
| 6,462,360 B1 | 10/2002 | Higgins, Jr. et al. |
| 6,472,694 B1 | 10/2002 | Wilson et al. |
| 6,477,285 B1 | 11/2002 | Shanley |
| 6,487,230 B1 | 11/2002 | Boucart et al. |
| 6,487,231 B1 | 11/2002 | Boucart et al. |
| 6,490,311 B1 | 12/2002 | Boucart et al. |
| 6,493,371 B1 | 12/2002 | Boucart et al. |
| 6,493,372 B1 | 12/2002 | Boucart et al. |
| 6,493,373 B1 | 12/2002 | Boucart et al. |
| 6,496,621 B1 | 12/2002 | Kathman et al. |
| 6,498,358 B1 | 12/2002 | Lach et al. |
| 6,501,973 B1 | 12/2002 | Foley et al. |

| | | | |
|---|---|---|---|
| 6,515,308 B1 | 2/2003 | Kneissl et al. | |
| 6,535,541 B1 | 3/2003 | Boucart et al. | |
| 6,542,531 B2 | 4/2003 | Sirbu et al. | |
| 6,567,435 B1 | 5/2003 | Scott et al. | |
| 2001/0004414 A1 | 6/2001 | Kuhn et al. | |
| 2002/0154675 A1 | 10/2002 | Deng et al. | |
| 2003/0038291 A1 | 2/2003 | Cao | |
| 2003/0039119 A1 | 2/2003 | Cao | |
| 2003/0039120 A1 | 2/2003 | Cao | |
| 2003/0039122 A1 | 2/2003 | Cao | |
| 2003/0039284 A1 | 2/2003 | Zheng | |
| 2003/0039294 A1 | 2/2003 | Ueki et al. | |
| 2003/0040133 A1 | 2/2003 | Horng et al. | |
| 2003/0040200 A1 | 2/2003 | Cao | |
| 2003/0072526 A1 | 4/2003 | Kathman et al. | |

FOREIGN PATENT DOCUMENTS

| | | |
|---|---|---|
| EP | 0288184 A2 | 10/1988 |
| EP | 0776076 A1 | 5/1997 |
| EP | 0822630 | 2/1998 |
| JP | 60123084 | 1/1985 |
| JP | 02054981 | 2/1990 |
| JP | 5299779 | 11/1993 |
| WO | WO 98/07218 | 2/1998 |
| WO | WO 98/57402 | 12/1998 |
| WO | WO 02/17445 A1 | 2/2002 |
| WO | WO 03/023457 A1 | 3/2003 |

OTHER PUBLICATIONS

Chemla et al., "Nonlinear Optical Properties of Semiconductor Quantum Wells", *Optical Nonlinearities and Instabilities in Semiconductors*, Academic Press, Inc., Copyright 1988, pp. 83-120.

Choe, et al., "Lateral oxidation of AlAs layers at elevated water vapour pressure using a closed-chamber system," Letter to the Editor, Semiconductor Science Technology, 15, pp. L35-L38, Aug. 2000.

Choa et al., "High-Speed Modulation of Vertical-Cavity Surface-Emitting Lasers", *IEEE Photonics Technology Letter*, vol. 3, No. 8, Aug. 1991, pp. 697-699.

Choquette et al., "High Single Mode Operation from Hybrid Ion Implanted/Selectively Oxidized VCSELs", 200 IEEE 17th International Semiconductor Laser Conference, Monterrey, CA pp. 59-60.

Choquette et al., "Lithographically-Defined Gain Apertures Within Selectively Oxidized VCSELs", paper CtuL6, Conference on Lasers and Electro-Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International.

Technical Group Newsletter, Apr. 2001.

Chua, et al., "Low-Threshold 1.57- μm VC-SEL's Using Strain-Compensated Quantum Wells and Oxide/Metal Backmirror," IEEE Photonics Technology Letters, vol. 7, No. 5, pp. 444-446, May 1995.

Chua, et al., "Planar Laterally Oxidized Vertical-Cavity Lasers for Low-Threshold High-Density Top-Surface-Emitting Arrays," IEEE Photonics Technology Letters, vol. 9, No. 8, pp. 1060-1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28-29, 1998, vol. 3291, pp. 70-71.

Farrier, Robert G., "Parametric control for wafer fabrication: New CIM techniques for data analysis," Solid State Technology, pp. 99-105, Sep. 1997.

Fushimi, et al., "Degradation Mechanism in Carbon-doped GaAs Minority-carrier Injection Devices," 34th Annual IRPS Proceedings, Dallas, TX., Apr. 29-May 2, 1996, 8 pages.

G. G. Ortiz, et al., "Monolithic Integration of In0.2 GA0.8As Vertical Cavity Surface-Emitting Lasers with Resonance-Enhanced Quantum Well Photodetectors", *Electronics Letters*, vol. 32, No. 13, Jun. 20, 1996, pp. 1205-1207.

G. Shtengel et al., "High-Speed Vertical-Cavity Surface-Emitting Lasers", *Photon. Tech. Lett.*, vol. 5, No. 12, pp. 1359-1361 (Dec. 1993).

Geib, et al., "Comparison of Fabrication Approaches for Selectively Oxidized VCSEL Arrays," Proceedings of SPIE, vol. 3946, pp. 36-40, 2000.

Graf, Rudolph, *Modern Dictionary of Electronics*, 6th ed., Indiana: Howard W. Sams & Company, 1984, p. 694.

Guenter et al., "Reliability of Proton-Implanted VCSELs for Data Communications", Invited paper, SPIE, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High-Power Single Mode Operation from Hybrid Ion Implanted/Selectively Oxidized VCSELs", 13th Annual Meeting IEEE Lasers and Electro-Optics Society 2000 Annual Meeting (LEOS 2000), Rio Grande, Puerto Rico, pp. 804-805.

Hawthorne, et al., "Reliability Study of 850 nm VCSELs for Data Communications," IEEE, pp. 1-11, May 1996.

Herrick, et al., "Highly reliable oxide VCSELs manufactured at HP/Agilent Technologies," Invited Paper, Proceedings of SPIE vol. 3946, pp. 14-19, 2000.

Hibbs-Brenner et al., "Performance, Uniformity and Yield of 850nm VCSELs Deposited by MOVPE", *IEEE Phot. Tech. Lett.*, vol. 8, No. 1, pp. 7-9, Jan. 1996.

Hideaki Saito, et al., "Controlling polarization of quantum-dot surface-emitting lasers by using structurally anisotropic self-assembled quantum dots," American Institute of Physics, Appl, Phys. Lett. 71 (5), pp. 590-592, Aug. 4, 1997.

Hornak et al., "Low-Temperature (10K-300K) Characterization of MOVPE-Grown Vertical-Cavity Surface-Emitting Lasers", *Photon. Tech. Lett.*, vol. 7, No. 10, pp. 1110-1112, Oct. 1995.

Huffaker et al., "Lasing Characteristics of Low Threshold Microcavity Layers Using Half-Wave Spacer Layers and Lateral Index Confinement", *Appl. Phys. Lett.*, vol. 66, No. 14, pp. 1723-1725, Apr. 3, 1995.

Jewell et al., "Surface Emitting Microlasers for Photonic Switching & Intership Connections", *Optical Engineering*, vol. 29, No. 3, pp. 210-214, Mar. 1990.

Jiang et al., "High-Frequency Polarization Self-Modulation in Vertical-Cavity Surface-Emitting Lasers", *Appl. Phys. Letters*, vol. 63, No. 26, Dec. 27, 1993, pp. 2545-2547.

K.L. Lear et al., "Selectively Oxidized Vertical Cavity Surface-Emitting Lasers with 50% Power Conversion Efficiency", *Elec. Lett.*, vol. 31, No. 3 pp. 208-209, Feb. 2, 1995.

Kash, et al., "Recombination in GaAs at the AlAs oxide-GaAs interface," Applied Physics Letters, vol. 67, No. 14, pp. 2022-2024, Oct. 2, 1995.

Kishino et al., "Resonant Cavity-Enhanced (RCE) Photodectors", *IEEE Journal of Quantum Electronics*, vol. 27, No. 8, pp. 2025-2034.

Koley B., et al., "Dependence of lateral oxidation rate on thickness of AlAs layer of interest as a current aperture in vertical-cavity surface-emitting laser structures", Journal of Applied Physics, vol. 84, No. 1, pp. 600-605, Jul. 1, 1998.

Kuchibhotla et al., "Low-Voltage High Gain Resonant_Cavity Avalanche Photodiode", *IEEE Phototonics Technology Letters*, vol. 3, No. 4, pp. 354-356.

Lai et al., "Design of a Tunable GaAs/AlGaAs Multiple-Quantum-Well Resonant Cavity Photodetector", *IEEE Journal of Quantum Electronics*, vol. 30, No. 1, pp. 108-114.

Lee et al., "Top-Surface Emitting GaAs Four-Quantum-Well Lasers Emitting at 0-85 um", *Electronics Letters*, vol. 24, No. 11, May 24, 1990, pp. 710-711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251-1252.

Maeda, et al., " Enhanced Glide of Dislocations in GaAs Single Crystals by Electron Beam Irradiation," Japanese Journal of Applied Physics, vol. 20, No. 3, pp. L165-L168, Mar. 1981.

Magnusson, "Integration of Guided-Mode Resonance Filters and VCSELs", Electo-Optics Research Center, Department of Electrical Engineering, University of Texas at Arlington, May 6, 1997.

Martinsson et al., "Transverse Mode Selection in Large-Area Oxide-Confined Vertical-Cavity Surface-Emitting Lasers Using a Shallow Surface Relief", IEEE Photon. Technol. Lett., 11(12), 1536-1538 (1999).

Miller et al., "Optical Bistability Due to Increasing Absorption", Optics Letters, vol. 9, No. 5, May 1984, pp. 162-164.

Min Soo Park and Byung Tae Ahn, "Polarization control of vertical-cavity surface-emitting lasers by electro-optic birefringence," Applied Physics Letter, vol. 76, No. 7, pp. 813-815, Feb. 14, 2000.

Morgan et al., "200 C, 96-nm Wavelength Range, Continuous-Wave Lasing from Unbonded GaAs MOVPE-Grown Vertical Cavity Surface-Emitting Lasers", IEEE Photonics Technology Letters, vol. 7, No. 5, May 1995, pp. 441-443.

Morgan et al., "High-Power Coherently Coupled 8×8 Vertical Cavity Surface Emitting Laser Array", Appl. Phys Letters, vol. 61, No. 10, Sep. 7, 1992, pp. 1160-1162.

Morgan et al., "Hybrid Dielectric/AlGaAs Mirror Spatially Filtered Vertical Cavity Top-Surface Emitting Laser", Appl. Phys. Letters, vol. 66, No. 10, Mar. 6, 1995, pp. 1157-1159.

Morgan et al., "Novel Hibrid-DBR Single-Mode Controlled GaAs Top-Emitting VCSEL with Record Low Voltage", 2 pages, dated prior to Dec. 29, 2000.

Morgan et al., "One Watt Vertical Cavity Surface Emitting Laser", Electron. Lett., vol. 29, No. 2, pp. 206-207, Jan. 21, 1993.

Morgan et al., "Producible GaAs-based MOVPE-Grown Vertical-Cavity Top-Surface Emitting Lasers with Record Performance", Elec. Lett., vol. 31, No. 6, pp. 462-464, Mar. 16, 1995.

Morgan et al., "Progress and Properties of High-Power Coherent Vertical Cavity Surface Emitting Laser Arrays", SPIE, Vo. 1850, Jan. 1993, pp. 100-108.

Morgan et al., "Progress in Planarized Vertical Cavity Surface Emitting Laser Devices and Arrays", SPIE, vol. 1562, Jul. 1991, pp. 149-159.

Morgan et al., "Spatial-Filtered Vertical-Cavity Top Surface-Emitting Lasers", CLEO, 1993, pp. 138-139.

Morgan et al., "Submilliamp, Low-Resistance, Continuous-Wave, Single-Mode GaAs Planar Verticle-Cavity Surface Emitting Lasers", Honeywell Technology Center, Jun. 6, 1995.

Morgan et al., "Transverse Mode Control of Vertical-Cavity Top-Surface Emitting Lasers", IEEE Photonics Technology Letters, vol. 4, No. 4, Apr. 1993, pp. 374-377.

Morgan et al., "Vertical-cavity surface-emitting laser arrays", Invited Paper, SPIE, vol. 2398, Feb. 6, 1995, pp. 65-93.

Morgan et al., Vertical-cavity surface emitting lasers come of age, Invited paper, SPIE, vol. 2683, 0-8194-2057, Mar. 1996, pp. 18-29.

Morgan, "High-Performance, Producible Vertical Cavity Lasers for Optical Interconnects", High Speed Electronics and Systems, vol. 5, No. 4, Dec. 1994, pp. 65-95.

Naone R.L., et al., "Tapered-apertures for high-efficiency miniature VCSELs", LEOS newsletter, vol. 13, No. 4, pp. 1-5, Aug. 1999.

Nugent et al., "Self-Pulsations in Vertical-Cavity Surface-Emitting Lasers", Electronic Letters, vol. 31, No. 1, Jan. 5, 1995, pp. 43-44.

Oh, T. H. et al., "Single-Mode Operation in Antiguided Vertical-Cavity Surface-Emitting Laser Using a Low-Temperature Grown AlGaAs Dielectric Aperature", IEEE Photon. Technol. Lett, 10(8), 1064-1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687-689, Jul. 2001.

Peck, D. Stewart, Comprehensive Model for Humidity Testing Correlation, IEEE/IRPS, pp. 44-50, 1986.

Ries, et al., "Visible-spectrum (λ=650nm) photopumped (pulsed, 300 K) laser operation of a verticle-cavity AlAs-AlGaAs/InAlP-InGaP quantum well heterostructure utilizing native oxide mirrors," Applied Physics Letters, vol. 67, No. 8, pp. 1107-1109, Aug. 21, 1995.

S.S. Wang and R. Magnusson, "Multilayer Waveguide-Grating Filters", Appl. Opt., vol. 34, No. 14, pp. 2414-2420, 1995.

S.S. Wang and R. Magnusson, "Theory and Applications of Guided-Mode Resonance Filters", Appl. Opt., vol. 32, No. 14, pp. 2606-2613, 1993.

Sah, et al., "Carrier Generation and Recombination in P-N Junctions and P-N Junction Characteristics," Proceedings of the IRE, pp. 1228-1243, Sep. 1957.

Schubert, "Resonant Cavity Light-Emitting Diode", Appl. Phys. Lett., vol. 60, No. 8, pp. 921-923, Feb. 24, 1992.

Shi, et al., "Photoluminescence study of hydrogenated aluminum oxide-semiconductor interface," Applied Physics Letters, vol. 70, No. 10, pp. 1293-1295, Mar. 10, 1997.

Smith, R.E. et al., Polarization-Sensitive Subwavelength Antireflection Surfaces on a Semiconductor for 975 NM, Optics Letters, vol. 21, No. 15, Aug. 1, 1996, pp. 1201-1203.

Spicer, et al., "The Unified Model For Schottky Barrier Formation and MOS Interface States in 3-5 Compounds," Applications of Surface Science, vol. 9, pp. 83-101, 1981.

Suning Tang et al., "Design Limitations of Highly Parallel Free-Space Optical Interconnects Based on Arrays of Vertical Cavity Surface-Emitting Laser Diodes, Microlenses, and Photodetectors", Journal of Lightwave Technology, vol. 12, No. 11, Nov. 1, 1994, pp. 1971-1975.

T. Mukaihara, "Polarization Control of Vertical-cavity Surface-Emitting Lasers by a Birefringent Metal/Semiconductor Polarizer Terminating a Distributed Bragg Reflector," Tokyo Institute of Technology, Precision and Intelligence Laboratory, pp. 183-184.

Tao, Andrea, "Wet-Oxidation of Digitally Alloyed AlGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface-Emitting Lasers," Japan J. Appl. Phys. vol. 33 (1994) pp. L227-L229, Part 2, No. 2B, Feb. 15, 1994.

Tu, Li-Wei et al., "Transparent conductive metal-oxide contacts in vertical-injection top-emitting quantum well lasers", Appl. Phys. Lett. 58 (8) Feb. 25, 1991, pp. 790-792.

Wieder, H.H., "Fermi level and surface barrier of $Ga_xIn_{1-x}As$ alloys," Applied Physics Letters, vol. 38, No. 3, pp. 170-171, Feb. 1, 1981.

Wipiejewski, et al., "VCSELs for datacom applications," Invited Paper, Part of the SPIE Conference on Vertical-Cavity Surface-Emitting Lasers III, San Jose, California, SPIE vol. 3627, pp. 14-22, Jan. 1999.

Y. M. Yang et al., "Ultralow Threshold Current Vertical Cavity Surface Emitting Lasers Obtained with Selective Oxidation", Elect. Lett., vol. 31, No. 11, pp. 886-888, May 25, 1995.

Yablononvitch et al., "Photonic Bandgap Structures", J. Opt. Soc. Am. B., vol. 10, No. 2, pp. 283-295, Feb. 1993.

Young et al., "Enhanced Performance of Offset-Gain High Barrier Vertical-Cavity Surface-Emitting Lasers", IEEE J. Quantum Electron., vol. 29, No. 6, pp. 2013-2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

Choquette, Kent D., et al., Design of Oxide Aperture Profile within Selectively Oxidized VCSELs, IEEE, Conference Proceedings, LEOS '98, 11th Annual Meeting, Orlando, Florida, Dec. 1-4, 1998, pp. 179-180.

Tai K., et al., "90% Coupling of Top Surface Emitting GAAS/ALGAAS Quantum Well Laser Output Into 8M Diameter Core Silica Fibre," Electronics Letters, IEE Stevenage, GB, vol. 26, No. 19, Sep. 13, 1990, pp. 1628-1629.

Zhou D., et al., "Simplified-Antiresonant Reflecting Optical Waveguide-Type Vertical-Cavity Surface-Emitting Lasers," Applied Physics Letters, American Institute of Physics, New York, vol. 76, No. 13, Mar. 27, 2000, pp. 1659-1661.

\* cited by examiner

VERSATILE METHOD AND SYSTEM FOR SINGLE MODE VCSELS

CROSS REFERENCE TO RELATED APPLICATION

This application is a divisional of U.S. patent application Ser. No. 09/724,820 filed Nov. 28, 2000 now U.S. Pat. No. 6,905,900.

TECHNICAL FIELD OF THE INVENTION

The present invention relates, in general, to semiconductor lasers and, in particular, to a versatile system for producing single transverse mode Vertical-Cavity Surface-Emitting Lasers (VCSELs).

BACKGROUND OF THE INVENTION

The Vertical Cavity Surface Emitting Laser (VCSEL) is rapidly becoming a workhorse technology for semiconductor optoelectronics. VCSELs can typically be used as light emission sources anywhere other laser sources (e.g., edge emitting lasers) are used, and provide a number of advantages to system designers. Hence, VCSELs are emerging as the light source of choice for modern high-speed, short-wavelength communication systems and other high-volume applications such as optical encoders, reflective/transmissive sensors and optical read/write applications.

Surface-emitting lasers emit radiation perpendicular to the semiconductor substrate plane, from the top or bottom of the die. A VCSEL is a surface-emitting laser having mirrors disposed parallel to the wafer surfaces that form and enclose an optical cavity between them. VCSELs usually have a substrate upon which a first mirror stack and second mirror stack are disposed, with a quantum well active region therebetween. Gain per pass is much lower with a VCSEL than an edge-emitting laser, which necessitates better mirror reflectivity. For this reason, the mirror stacks in a VCSEL typically comprise a plurality of Distributed Bragg Reflector (DBR) mirrors, which may have a reflectivity of 99% or higher. An electrical contact is usually positioned on the second mirror stack, and another contact is provided at the opposite end in contact with the substrate. When an electrical current is induced to flow between the two contacts, lasing is induced from the active region and emits through either the top or bottom surface of the VCSEL.

VCSELs may be broadly categorized into multi-transverse mode and single-transverse mode, each category being advantageous in different circumstances. A goal in manufacturing single-mode VCSELs is to assume single-mode behavior over all operating conditions, without compromising other performance characteristics. Generally, the active regions of single transverse mode VCSELs require small lateral dimensions, which tend to increase the series resistance and beam divergence angle. Furthermore, a device that is single-mode at one operating condition can become multi-mode at another operating condition, an effect that dramatically increases the spectral width and the beam divergence of the emitted radiation of the VCSEL.

Depending upon the application, the output mode of a VCSEL can either positively or negatively affect its use in signal transmission and other applications. The mode structure is important because different modes can couple differently to a transmission medium (e.g., optical fiber). Additionally, different modes may have different threshold currents, and can also exhibit different rise and fall times. Variation in threshold currents, which can be caused by different modes, combined with different coupling efficiencies of different modes can cause coupling into a transmission medium to vary in a highly non-linear manner with respect to current. Variable coupling to a transmission medium, combined with different rise and fall times of the various modes, can cause signal pulse shapes to vary depending on particular characteristics of the coupling. This can present problems in signal communications applications where transmission depends on a consistent and reliable signal. Other applications (e.g., printing devices, analytical equipment) may require a consistent and focused light source or spectral purity characteristics that render multiple mode sources inefficient or unusable.

Manufacturing a VCSEL with mode control and high performance characteristics poses a number of challenges. It is difficult to manufacture VCSELs that efficiently operate in the lower order mode (single mode). Most conventional VCSELs tend to lase in higher-order transverse modes, whereas single transverse mode lasing is preferred for some applications, such as sensors. Conventional attempts to produce a single mode VCSEL have generally resulted in structures having output power insufficient for practical use in most applications, as they remain single mode only over small current ranges. Usually, to manufacture a VCSEL, a relatively large current aperture size is required to achieve a low series resistance and high power output. A problem with a large current aperture is that higher order lasing modes are introduced so that single mode lasing only occurs just above threshold, if at all. Manufacturing a VCSEL with a smaller current aperture to obtain single mode behavior causes multiple problems: the series resistance becomes large, the beam divergence angle becomes large, and the attainable power becomes small. Some conventional anti-guide structures may achieve this but suffer from manufacturing difficulties, particularly in requiring an interruption in epitaxial growth, a patterning step, and subsequent additional epitaxy. Other large single mode VCSELs require multi-step MBE or MBE/MOCVD combinations to manufacture, creating alignment and yield problems; increasing production costs and reducing commercial viability.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Therefore, a versatile system for producing a single mode VCSEL in a cost-effective and efficient manner, sustaining single mode operation over all current ranges is now needed, providing commercially viable VCSEL power output and performance while overcoming the aforementioned limitations of conventional methods.

In the present invention, electrical, thermal, and geometric optical properties of VCSEL components are designed and selected to provide current peaking in the center of a VCSEL device, coincident with the peak of the lowest order mode and to maximize loss in, or eliminate completely, higher order modes. Optionally, other mode control techniques can be used in conjunction with the teachings of the present invention to optically tailor the loss profile to prefer the fundamental mode.

The present invention provides structures and methods for producing a single mode VCSEL comprising a substrate, a bottom contact portion disposed upon a lower surface of the substrate, a lower mirror portion disposed upon an upper surface of the substrate, an active region disposed upon the lower mirror portion, and a current spreading upper mirror portion formed from electrically isotropic material and disposed upon the active region, an equipotential portion, which can include an additional mirror, disposed upon the upper current spreading mirror portion, an insulating layer interposed between the upper current spreading mirror portion and the equipotential portion and adapted to form an aperture therebetween, and an upper contact portion disposed upon the equipotential layer outside the perimeter of the aperture.

The present invention provides a VCSEL component adapted to provided single mode operation over wide current ranges, comprising a semiconductor substrate having a lower surface and an upper surface, a bottom electrical contact disposed along the lower surface of the semiconductor substrate, a lower mirror formed of n-type material and disposed upon the upper surface of the semiconductor substrate, an active region having a plurality of quantum wells disposed upon the lower mirror portion, an upper current spreading mirror formed from electrically isotropic material and disposed upon the active region, an equipotential layer, which can include another mirror, disposed upon the upper mirror portion, a first upper electrical contact disposed upon the equipotential layer at a first lateral end of the VCSEL component, a second upper electrical contact disposed upon the equipotential layer at a second end of the VCSEL component at a particular distance from the first upper electrical contact, a first isolation region disposed beneath the first upper contact and traversing the equipotential layer, the upper mirror, the active region, and the lower mirror, a second isolation region disposed beneath the second upper contact and traversing the equipotential layer, the upper mirror, the active region, and the lower mirror, and an insulating layer interposed between the upper mirror and the equipotential layer and adapted to form therebetween an aperture.

The present invention further provides a method of providing antiguide mode selectivity in a VCSEL, including the forming of a VCSEL structure having a substrate, a bottom contact portion disposed upon a lower surface of the substrate, a lower mirror portion disposed upon an upper surface of the substrate, an active region disposed upon the lower mirror portion, and an upper current spreading mirror portion formed from electrically isotropic material and disposed upon the active region, providing a substantially equipotential layer disposed upon the upper mirror portion, selectively interposing an electrically insulating layer between the upper mirror portion and the equipotential layer to form an aperture therebetween, wherein the electrically insulating layer is adapted to provide a greater nominal cavity resonance outside the aperture than inside it, and providing an upper contact portion disposed upon the equipotential layer.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

It should be understood that the principles and applications disclosed herein can be applied in a wide range of optoelectronic applications. For purposes of explanation and illustration, the present invention is hereafter described in reference to VCSEL laser sources. However, the same system might be applied in other applications where a single mode source is utilized.

As previously discussed, one of the limitations of conventional single mode VCSEL approaches is their tendency to become multi-moded as current is increased, resulting in a very small effective current range and, hence, minimal power output, for single mode operation. Conventional VCSELs generally become multi-moded as current is increased because of current crowding near the edge of the emitting region and the resulting reduction in available gain in the center of the device, which is also caused by the sharp peaking of the lowest order mode in the center. This is true even for conventional devices having mode control structures.

In contrast, the present invention provides current peaked in the center of a VCSEL device, coincident with the peak of the fundamental (i.e., lowest order) mode. Optionally, other mode control techniques can be used in conjunction with the teachings of the present invention to optically tailor the loss profile to prefer the fundamental mode (e.g., use of long cavities, top surface patterning).

Figure 1:
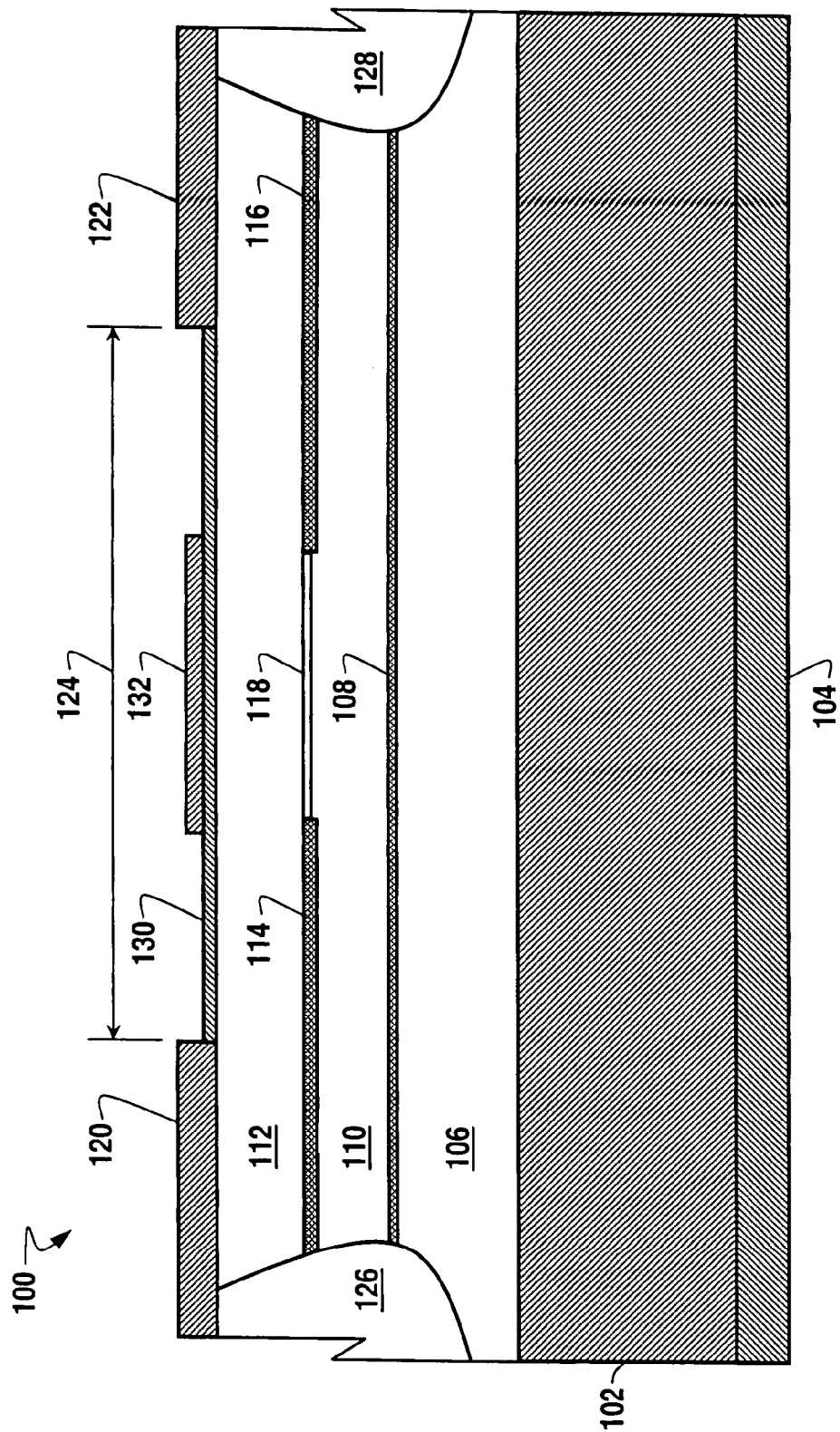
FIG. 1 is an illustrative schematic of VCSEL component according to the present invention.

The present invention thus provides a single mode VCSEL having output power sufficient to meet the performance requirements of cost-sensitive commercial applications. Referring first to FIG. 1, a cross-sectional view of a VCSEL component 100 in accordance with the present invention is illustrated. VCSEL 100 comprises a substrate 102, formed of a suitable semiconductor material (e.g., Galium Arsenide [GaAs], Indium Phosphide [InP], or combinations thereof). VCSEL 100 further comprises a backside contact portion 104, formed of a suitable metallic or other conductive material, and adjoining a lower surface of substrate 102. A first semiconductor mirror stack 106 is disposed along the upper surface of substrate 102. Mirror 106 comprises a plurality of mirror pairs of alternating low and high refractive indexed material (e.g., DBR mirrors) and can be n-doped, for example. Disposed upon an upper surface of mirror 106 is active region 108. Active region 108 contains a number of quantum wells (e.g., three GaAs quantum wells). A second semiconductor current spreading mirror stack 110 is disposed along an upper portion of region 108 and can include a plurality of mirror pairs of p-doped material, for example. A conduction layer 112 is disposed atop and adjoining current spreading mirror 110. The resistivity of mirror 110 is much higher than in layer 112, and the conductivity of mirror 110 is as isotropic as possible. Layer 112 comprises a very high conductivity layer (e.g., 4 to 10 times the conductance of mirror 110) on top of mirror 110, which acts substantially like an equipotential (e.g., resistivity of about 0.01 ohm/cm). Layer 112 can comprise a highly doped semiconductor grown on the lower structures of VCSEL 100 (e.g., AlGaAs). Layer 112 can also comprise or include a DBR mirror structure. Alternatively, layer 112 can comprise a substantially equipotential portion of mirror 110. Because n-type mirrors typically have anisotropic conduction, it can be preferable to use a p-type material to form mirror 110. In VCSEL production processes where tunnel junctions produce nearly ohmic contact between n and p regions, without normal p-n junction characteristics, mirrors 106 and 110 can both be formed of either p-type or n-type material, as described hereafter in greater detail with reference to FIG. 4.

Generally, when the composition of any of the materials used comprises more than two chemical elements, that material's thermal conductivity decreases significantly. This increases thermal lensing while decreasing maximum power. It is thus desirable to use binary compositions, especially in proximity to region 108 (i.e., in mirrors 106 and 110).

VCSEL 100 further comprises a first electrical insulation region 114 and a second electrical insulation region 116, interposed between mirror 110 and conduction layer 112 in distally separate relation to one another, forming an aperture 118 between mirror 110 and layer 112. Although, as depicted in the cross sectional view of FIG. 1, regions 114 and 116 are separate structures, it is important to note that they can include segments of a single contiguous insulating region having the aperture (e.g., a circular aperture) formed therein. In this embodiment, there should be some electrical insulation between layer 112 and mirror 110, except for the area of aperture 118. This confines current flow toward the center of VCSEL 100. Optionally, regions 114 and 116 can be formed further within layer 110 (i.e., not immediately adjacent to layer 112), as described in later reference to FIG. 3. Insulation regions 114 and 116 can comprise an oxide, or some other suitable insulator available in the desired semiconductor process. The insulating regions can be any insulating material of any thickness (e.g., $Al_2O_3$ or air), but is optimal when reflectance of mirror 110, as measured from region 108, is minimized by the choice of thickness and position of the insulating regions. This causes more loss for higher order modes. Thus, the insulation regions can be designed or patterned to increase operational selectivity toward the fundamental mode. The thickness and positioning of the insulating regions can also be optimized such that the nominal cavity resonance outside the aperture 118 is at a longer wavelength than inside, providing an antiguide effect. Despite lower real indices of materials such as $Al_2O_3$, proper thickness and positioning of the insulating regions will provide an effective higher index and result in a longer resonant wavelength. It is possible that, depending upon the processes and materials used, extended insulation areas may emanate from regions 114 and 116, having different electrical and optical effects on the performance of VCSEL 100. This phenomenon may be exploited to provide independent control of the optical and resistive effects, by altering the composition of the insulation regions (e.g., adding a proton implant to the regions).

VCSEL component 100 further comprises a first upper contact portion 120 and a second upper contact portion 122. Contacts 120 and 122 are formed of a suitable metallic or other conductive material atop conduction layer 112 in distally separate relation to one another, separated by a span 124. As depicted, regions 114 and 116 are formed beneath, and extending beyond, contacts 120 and 122, respectively, such that aperture 118 is smaller than span 124. Alternatively, contacts 120 and 122 and regions 114 and 116 can be formed such that contacts 120 and 122 overlap regions 114 and 116, resulting in an aperture 118 larger than span 124. As shown in FIG. 1, a first isolation region 126 is implanted beneath contact 120, traversing portions of layer 112, region 114, mirror 110, and region 108, and extending into mirror 106. Similarly, a second isolation region 128 is implanted beneath contact 122, traversing portions of layer 112, region 116, mirror 110, and region 108, and extending into mirror 106.

The conductivity and sheet conductance of layer 112 are many times (e.g., an order of magnitude) that of mirror 110. Layer 112 is formed of a thickness sufficient to enhance reflectivity of mirror 110. The lateral conductance of mirror 110 should be low, such that lateral current spreading is minimized. Mirror 110 and 112 are designed to have a phase relationship such that the combined structures provide maximum reflectivity inside aperture 118. Layer 112 provides mirror reflectivity because of its interface with the outside world.

Vertical conductance of mirror 110 should be high enough not to increase resistance excessively. Because the mirror stack is made of semiconductors of different band gaps, the mirror should be designed as isotropically conductive as is reasonable to reduce lateral current flow. As such, layers which have higher mobilities need lower doping, and layers with lower mobilities need higher doping, so that the resistivity is nearly the same all the way through and independent of direction. The product of the hole concentration and the mobility needs to be a constant for as much of mirror 110 as is possible. The interfaces between the semiconductors need to be doped more heavily and graded due to lower mobilities in the intermediate compositions of the grade and the modulation doping of lower gap material adjacent to wider gap material.

Figure 2:
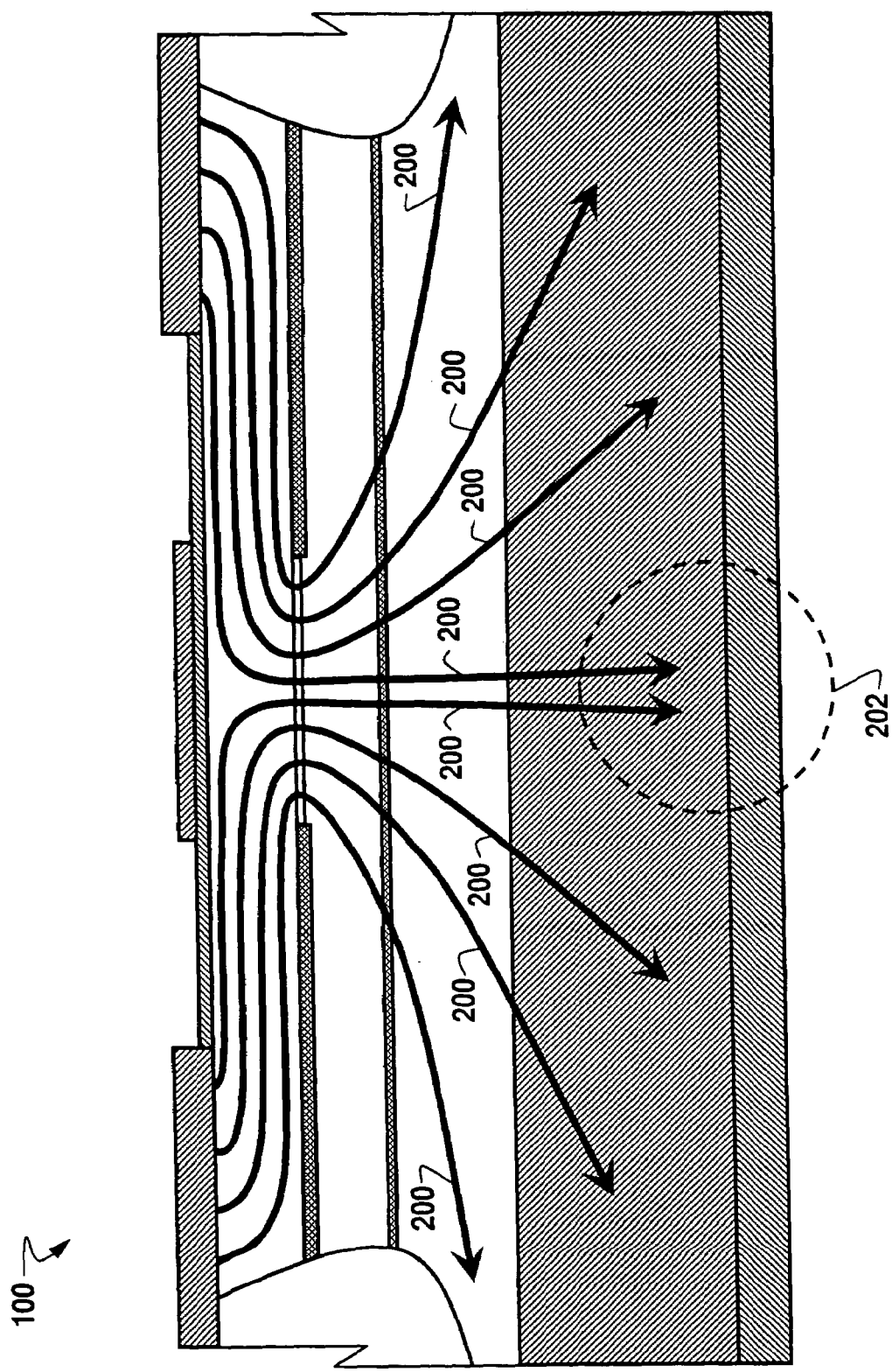
FIG. 2 is an illustrative diagram of the operation of the VCSEL component in FIG. 1.

By forming an equipotential portion 112, and current spreading mirror 110 with the properties described above, and providing the current-restrictive aperture 118 therebetween, the present invention focuses the VCSEL current in the center of the device and at the lowest order mode, while minimizing and dispersing fringe current and effectively eliminating higher order modes. Mode selectivity is further provided by the antiguide effects of the present invention, as described above. FIG. 2 provides an illustration of advantages of the present invention. Indicators 200 depict operational current flow of VCSEL 100. The current density is maximized in the center portion 202 of VCSEL 100, coinciding with the peak of the lowest order mode. Current coinciding with higher order modes is widely dispersed, maximizing loss for those modes and effectively damping all but the lowest order mode. The present invention thus provides a single mode (i.e. the lowest order mode) VCSEL device, operational over a wide current range.

As previously indicated, a number of optional measures can be implemented to further increase modal selectivity in conjunction with the present inventions. Spacing and thickness of the various component layers of VCSEL 100 can be varied to increase spreading effects (i.e., loss) of current associated with higher order modes (e.g., thickness of layers 114 and 116 can be increased). Additional structures can be added to VCSEL 100 to enhance optical selectivity. Referring back to FIG. 1, one such option is depicted in conjunction with VCSEL 100. A dielectric stack mode control structure is disposed atop layer 112. This structure comprises a first dielectric layer 130, disposed on an upper surface of layer 112 along span 124, and a second dielectric layer 132, disposed atop layer 130. Layer 132 can be positioned to align with aperture 118. Layer 130 is formed of a suitable material (e.g., $SiO_2$) with a thickness equivalent to one fourth (or some multiple thereof) the wavelength of light sourced by VCSEL 100. Layer 132 is formed of a suitable material (e.g., $Si_3N_4$) of a thickness, when combined with the thickness of layer 130, equivalent to one half (or some multiple thereof the wavelength of light sourced by VCSEL 100. The effective mirror reflectivity under layer 130 is reduced and optical loss is increased, except for the area under layer 132, where the mirror reflectivity is either unaffected or enhanced, depending upon the material used to form layer 132. Thus, reflection back to the mirror under layer 132 is greater; and larger, higher order modes are suppressed. These effects can be combined with the other teachings of the present invention to further strengthen single mode selection and output.

Figure 3:
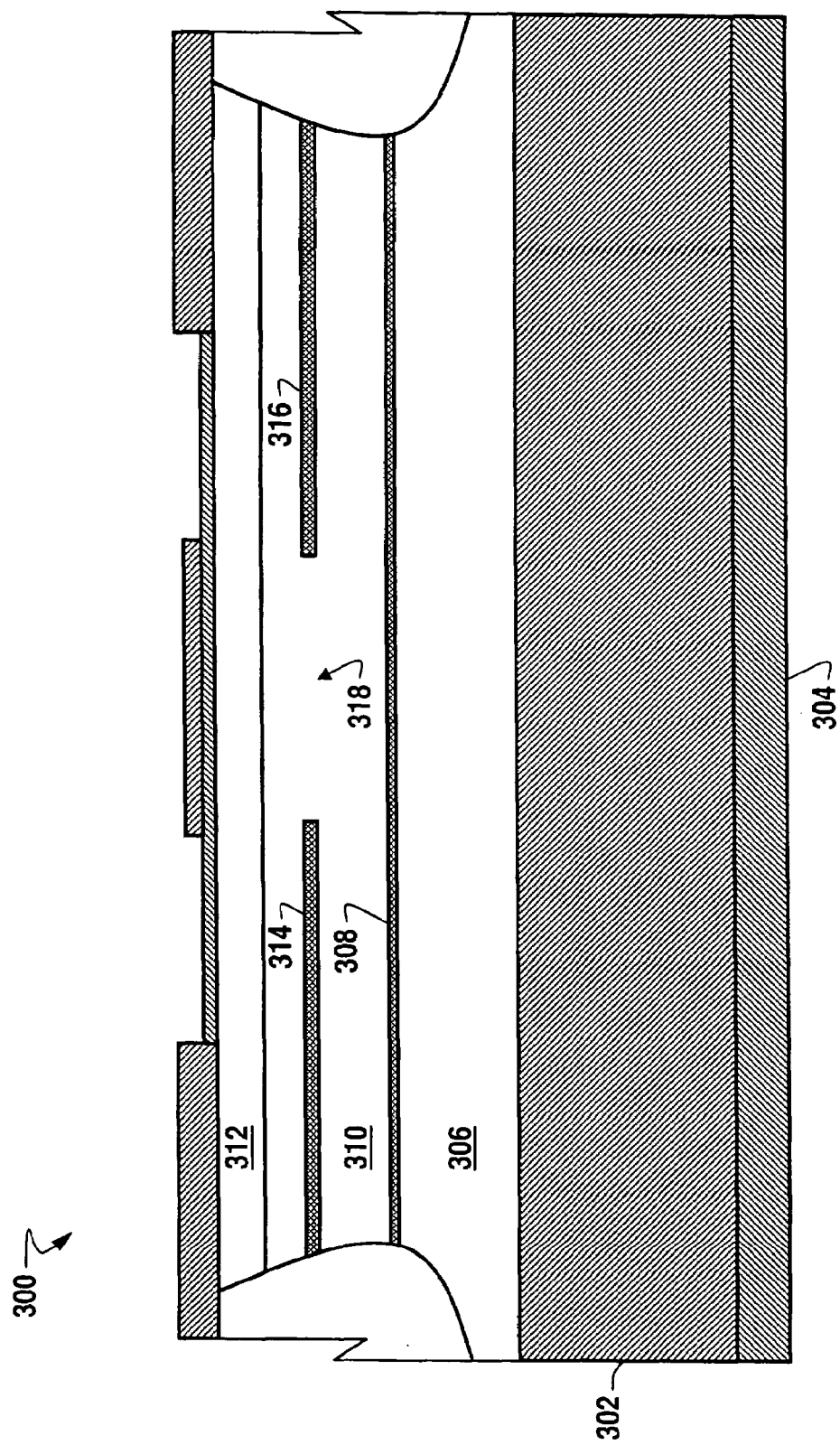
FIG. 3 is an illustrative schematic of another VCSEL component according to the present invention.

Referring now to FIG. 3, a cross-sectional view of an alternative embodiment of a VCSEL component 300 in accordance with the present invention is illustrated. VCSEL 300 is substantially similar, in materials and construction, to VCSEL 100 of FIG. 1, with the exceptions detailed hereafter. VCSEL 300 comprises a substrate 302 and a backside contact portion 304 adjoining a lower surface of substrate 302. A first semiconductor mirror stack 306 is disposed along the upper surface of substrate 302. Disposed upon an upper surface of mirror 306 is active region 308. A second semiconductor mirror stack 310 is disposed along an upper portion of region 308, and a conduction layer 312 is disposed atop and adjoining mirror 310. VCSEL 300 further comprises a first electrical insulation region 314 and a second electrical insulation region 316, medially interposed within mirror 310 between region 308 and conduction layer 312, in distally separate relation to one another, forming an aperture 318. VCSEL 300 can be so formed as long as peak gain and current density is realized toward the center of VCSEL 300. In this embodiment, the portion of mirror 310 above regions 314 and 316 (i.e., that portion directly adjacent to layer 312) should have as low a resistivity as is reasonable based on control constraints and free carrier absorption constraints.

As previously taught, heating must be prevented. Free carrier absorption causes a lot of heating in VCSEL devices. Heating can be minimized by having as low a doping at the electric field peaks as possible. I-R heating can become severe if doping is reduced excessively to reduce free carrier absorption. Keeping this in mind, reference is now made to FIG. 4, which presents an embodiment of the present invention addressing these concerns and building upon the teachings above.

Figure 4:
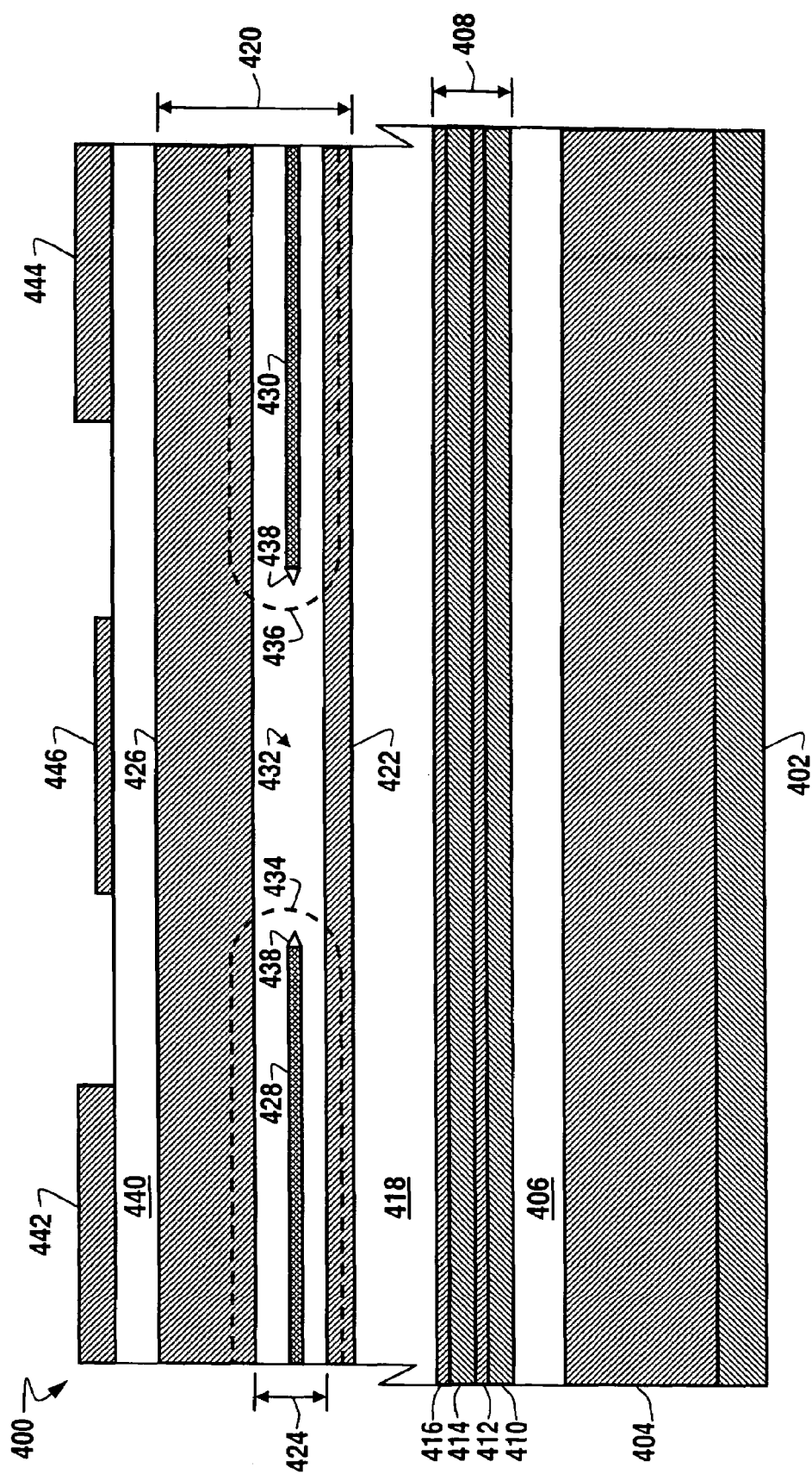
FIG. 4 is an illustrative schematic of VCSEL component according to the present invention.

FIG. 4 depicts a cross-sectional view of an embodiment of a VCSEL component 400 in accordance with the present invention. VCSEL 400 comprises a substrate 402, formed of a suitable semiconductor material (e.g., Galium Arsenide [GaAs], Indium Phosphide [InP], or combinations thereof). VCSEL 400 further comprises a first semiconductor mirror stack 404 disposed along the upper surface of substrate 402. Mirror 404 comprises a plurality of mirror pairs of alternating low and high refractive indexed material (e.g., DBR mirrors). AlGaAs DBR mirrors, using AlAs as the lower index extreme to improve thermal conductivity, can be utilized. Alternatively, AlInGaAsPSb, lattice matched to InP with a possible extreme composition of InP, can be utilized to improve thermal conductivity. Disposed upon an upper surface of mirror 404 is a first heat conduction layer 406. Layer 406 comprises a substrate-appropriate material (e.g., AlAs for GaAs substrates, InP for InP substrates). Layer 406 is periodically doped to maximize doping at minima of electric fields and can be formed with a thickness on the order of one micron. This periodic doping can comprise doping heavily in the nulls of the electric field and doping lightly at the peaks of the electric field. The periodic doping improves conductivity and reduces the free carrier absorption. Use of uniformly heavy doping generally reduces series' resistance.

Disposed upon layer 406 is active region 408. Active region 408 comprises a lower p-n junction layer 410 disposed upon layer 406, a first tunnel junction 412 disposed upon layer 410, an upper p-n junction layer 414 disposed upon junction 412, and a second tunnel junction 416 disposed upon layer 414. Layers 410 and 414 can contain a number of quantum wells. By using tunnel junctions 412 and 416, a designer can then utilize n-type material in the mirror and heat conduction layers, providing significant reduction in free carrier absorption for a given conductivity. Within region 408, this is a particularly effective way to reduce currents and heating effects.

Disposed upon an upper surface of region 408 is a second heat conduction layer 418. Layer 418 is also isotropically formed as a current spreader. Layer 418 comprises a lightly doped substrate-appropriate material (e.g., AlAs for GaAs substrates, InP for InP substrates).

A second semiconductor mirror stack 420 is disposed above layer 418. Mirror 420 comprises a first upper mirror layer 422, a second upper mirror layer 424, and a third upper mirror layer 426. Layer 422 is formed to be as isotropic as possible and is lightly doped for free carrier absorption. Layer 422 can be formed to be of a thickness approximately equal to 4.5 periods. Layer 422 can comprise a plurality of mirror pairs of either n-doped or p-doped material, depending upon the process used, as previously noted. If n-type material is used, layer 422 can be formed above layer 424 (not shown). If layer 422 is formed as shown in FIG. 4, layer 418 may be formed with a thickness of approximately one micron, for example. If layer 422 is formed above layer 424, then layer 418 should be thicker, formed with a thickness of approximately 2.6 microns, for example.

VCSEL 400 further comprises a first electrical insulation region 428 and a second electrical insulation region 430, interposed within layer 424 in distally separate relation to one another, forming an aperture 432 therebetween. The formation of aperture 432 confines current flow towards the center of VCSEL 400. As previously described, insulation regions 428 and 430 can comprise any appropriate insulating material of any thickness (e.g., an oxide) provided that they are formed toward minimizing reflectance of mirror 420, as measured from region 408, and also toward optimizing nominal cavity resonance to provide an antiguiding. Again, it is possible that, depending upon the processes and materials used, extended resistive regions 434 and 436 may emanate from regions 428 and 430, respectively, having different electrical and optical effects on the performance of VCSEL 400. As previously taught, regions 434 and 436 can be manipulated through design to provide independent optical and resistive control; however, generally, it is desirable that these regions are confined as narrowly as possible around the immediate area of regions 428 and 430.

Inside aperture 432, current density is higher than anywhere else, as is later illustrated in reference to FIG. 5. This current density causes significant IR heating, which must be prevented. Thus, layer 424 can comprise a heavily p-doped type material, or a moderately n-doped type material, or any other appropriate material (e.g., n-InP for an InP based VCSEL) that provides reduced series resistance and heating effects within aperture 432. Optionally, tapers 438 can be formed on the ends of regions 428 and 430, with tips positioned at electric field nulls, to enhance current confinement and mode selectivity. Layer 426 comprises a heavily doped material formed of appropriate thickness (e.g., approximately 16 periods for AlGaAs material) to optimize resistance and form, in relation to a conduction layer 440, an equipotential. Conduction layer 440 is disposed atop and adjoining mirror 420 and is formed of a very heavily doped material to minimize resistance. The resistivity of mirror 420 is higher than in layer 440, and the conductivity of mirror 420 is as isotropic as possible. Layer 440 comprises a very high conductivity layer on top of mirror 420, which acts substantially like an equipotential.

VCSEL component 400 further comprises a first upper contact portion 442 and a second upper contact portion 444. Contacts 442 and 444 are formed of a suitable metallic or other conductive material atop conduction layer 440 in distally separate relation to one another, separated by a span 124. VCSEL 400 can further comprise an appropriate mode selectivity structure 446, such as a dielectric mirror or mode control structure as previously described.

Figure 5:
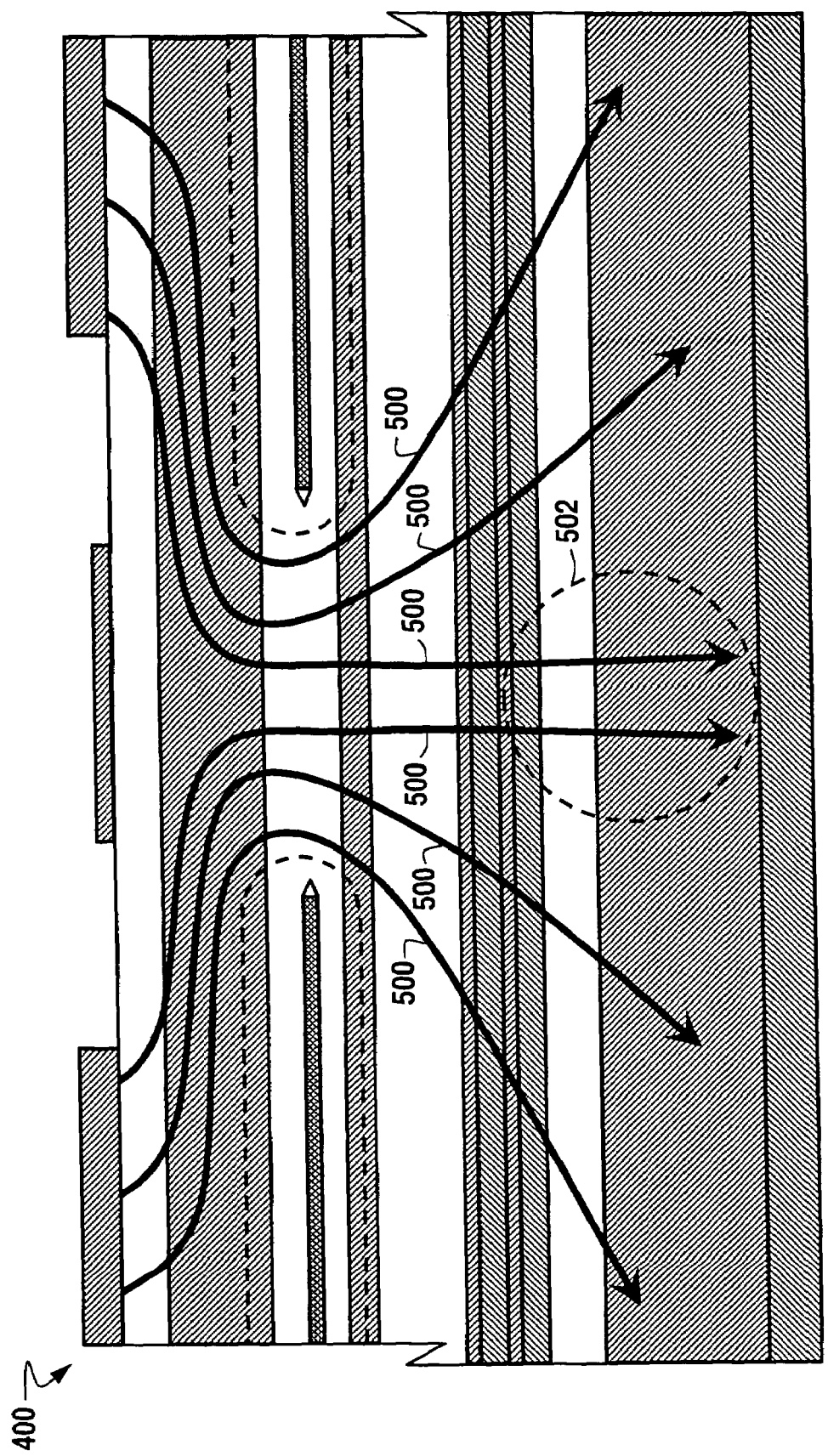
FIG. 5 is an illustrative diagram of the operation of the VCSEL component in FIG. 4.

FIG. 5 provides an illustration of the current flow of VCSEL 400. Indicators 500 depict operational current flow of VCSEL 400. The current density is maximized in the center portion 502 of VCSEL 400, coinciding with the peak of the lowest order mode. Current coinciding with higher order modes is widely dispersed, maximizing loss for those modes and effectively damping all but the lowest order mode. As previously taught, the present invention thus provides a single mode (i.e. the lowest order mode) VCSEL device, operational over a wide current range.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. The teachings and concepts of the present invention can be applied to other types of components, packages and structures, such as VCSEL components produced with other than a (100) orientation. The invention is applicable independent of a particular package configuration. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The invention claimed is:

1. An optoelectronic device, comprising:
   a first mirror;
   a second mirror;
   one or more heat conduction layers formed between the first mirror and the second mirror, at least one of the heat conduction layers being periodically doped to maximize doping at minima of electric fields in the optoelectronic device;
   an active region situated between the first mirror and the second mirror;
   an insulating layer positioned in or adjacent to the first mirror, the insulating layer defining an aperture; and
   an isolation implant region extending around, and spaced outwardly from, at least part of the aperture of the insulating layer and traversing through the insulating layer and at least part of the first mirror.

2. An optoelectronic device according to claim 1 wherein the isolation implant region also traverses through the active region.

3. An optoelectronic device according to claim 2 wherein the isolation implant region traversed through the active region and at least partially into the second mirror.

4. An optoelectronic device according to claim 1 wherein the isolation implant region extends entirely around the perimeter of the aperture of the insulating layer.

5. An optoelectronic device according to claim 1 wherein the isolation implant region defines an aperture that is larger than the aperture of the insulating layer.

6. An optoelectronic device according to claim 5 wherein the aperture of the isolation implant region is substantially coaxial with the aperture of the insulating layer.

7. An optoelectronic device according to claim 1, wherein the first mirror comprises:
   a first DBR layer that has substantially isotropic conductivity;
   a second DBR layer including the insulating layer, the second DBR layer having a doping level to minimize series resistance and heating effects in the aperture; and
   a third DBR layer formed over the second DBR layer.

8. An optoelectronic device according to claim 1 wherein the optoelectronic device is a Vertical Cavity Surface Emitting Laser (VCSEL).

9. A method for forming an optoelectronic device, the method comprising the steps of:
   providing a lower mirror;
   providing an active region above the lower mirror;
   providing a first DBR layer in an upper mirror above the active region, the first DBR layer having a first doping level;
   providing a second DBR layer in the upper mirror, the second DBR layer including an insulating layer that defines an aperture, the second DBR layer further having a second doping level that is higher than the first doping level;

providing an isolation implant in an implant region, wherein the implant region extends around, and is spaced outwardly from, at least part of the aperture of the insulating layer and traverses down through at least part of the upper mirror and through the insulating layer;

providing a third DBR layer formed above the second DBR layer; and providing one or more conduction layers formed between the lower mirror and the upper mirror, the one or more conduction layers being periodically doped such that heavy doping occurs at nulls of an electric field in the optoelectronic device.

10. An optoelectronic device A method according to claim 9 wherein the isolation implant region traverses through the active region.

11. A method according to claim 10 wherein the isolation implant region traverses through the active region and at least partially into the lower mirror.

12. A method according to claim 9 wherein the isolation implant region extends entirely around the perimeter of the aperture of the insulating layer.

13. A method according to claim 9 wherein the isolation implant region defines an aperture that is larger than the aperture of the insulating layer.

14. A method according to claim 13 wherein the aperture of the isolation implant region is substantially coaxial with the aperture of the insulating layer.

15. A method according to claim 9 wherein the isolation implant region is implanted with protons.

16. A method according to claim 9
wherein the optoelectronic device is a Vertical Cavity Surface Emitting Laser (VCSEL).

* * * * *

UNITED STATES PATENT AND TRADEMARK OFFICE
CERTIFICATE OF CORRECTION

| | | |
|---|---|---|
| PATENT NO. | : 7,221,691 B2 | Page 1 of 1 |
| APPLICATION NO. | : 10/617290 | |
| DATED | : May 22, 2007 | |
| INVENTOR(S) | : Johnson et al. | |

It is certified that error appears in the above-identified patent and that said Letters Patent is hereby corrected as shown below:

Column 7
Line 37, add --)-- after "thereof"

Column 11
Line 17, delete "An optoelectronic"

Column 12
Line 15, remove carriage return after "9"

Signed and Sealed this

Tenth Day of August, 2010

David J. Kappos
*Director of the United States Patent and Trademark Office*